US010727801B2

(12) United States Patent
Beaver et al.

(10) Patent No.: US 10,727,801 B2
(45) Date of Patent: Jul. 28, 2020

(54) METHOD FOR FABRICATING PIEZOELECTRIC QUARTZ RESONATOR

(71) Applicant: INTERQUIP ELECTRONICS (SHENZHEN) CO., LTD, Shenzhen, Guangdong (CN)

(72) Inventors: William Dean Beaver, Guangdong (CN); Huiping Liang, Guangdong (CN); Xiaoming Sun, Guangdong (CN); Guangyu Wu, Guangdong (CN); Junchao Xie, Guangdong (CN)

(73) Assignee: INTERQUIP ELECTRONICS (SHENZHEN) CO., LTD., Shenzhen (CN)

( * ) Notice: Subject to any disclaimer, the term of this patent is extended or adjusted under 35 U.S.C. 154(b) by 559 days.

(21) Appl. No.: 15/403,168

(22) Filed: Jan. 10, 2017

(65) Prior Publication Data
US 2017/0149409 A1 May 25, 2017

Related U.S. Application Data

(63) Continuation of application No. PCT/CN2014/091108, filed on Nov. 14, 2014.

(30) Foreign Application Priority Data

Oct. 22, 2014 (CN) .......................... 2014 1 0566200

(51) Int. Cl.
*H03H 3/02* (2006.01)
*H03H 9/10* (2006.01)
(Continued)

(52) U.S. Cl.
CPC ............ *H03H 3/02* (2013.01); *H03H 9/0542* (2013.01); *H03H 9/10* (2013.01); *H03H 9/1007* (2013.01);
(Continued)

(58) Field of Classification Search
CPC ............ H03H 3/02; H03H 2003/0478; H03H 9/0542; H03H 9/10; H03H 9/1007;
(Continued)

(56) References Cited

U.S. PATENT DOCUMENTS

| 2004/0097086 A1* | 5/2004 | Igarashi | .................. H01L 24/97 438/690 |
| 2009/0305076 A1* | 12/2009 | Wong | ...................... H01L 24/97 428/607 |
| 2015/0295557 A1* | 10/2015 | Takase | ..................... H03H 9/10 310/315 |

FOREIGN PATENT DOCUMENTS

| CN | 102355225 A | 2/2012 |
| CN | 203151440 U | 8/2013 |
| JP | 06252675 A * | 9/1994 |

OTHER PUBLICATIONS

Machine Translation (English) of Chinese Patent Publication, CN 1023-55225, Sep. 2019. (Year: 2019).*
(Continued)

*Primary Examiner* — A. Dexter Tugbang (57) ABSTRACT

A method for fabricating a piezoelectric quartz crystal resonator is disclosed, which comprises: arranging a plurality of design units on a circuit board, wherein each design unit includes a quartz crystal resonator and a thermistor, and a division clearance is preset between every two adjacent design units; in each design unit, arranging at least one extension welding pad and at least one resonator welding pad; arranging at least one thermistor welding pad corresponding to the thermistor at the circuit board; welding the quartz crystal resonator and the thermistor onto their corresponding welding pads respectively; using thermoplastic material to seal the welded quartz crystal resonator and thermistor; dividing the circuit board processed by the thermoplastic material according to the design units.

4 Claims, 8 Drawing Sheets

(51) Int. Cl.
    *H03H 9/05*        (2006.01)
    *H03H 9/19*        (2006.01)
    *H03H 3/04*           (2006.01)
    *H01L 21/56*          (2006.01)
    *H01L 23/00*          (2006.01)

(52) U.S. Cl.
    CPC ............. *H03H 9/19* (2013.01); *H01L 21/561*
        (2013.01); *H01L 24/97* (2013.01); *H03H*
        *2003/0478* (2013.01); *Y10T 29/42* (2015.01);
        *Y10T 29/49146* (2015.01); *Y10T 29/49798*
        (2015.01)

(58) Field of Classification Search
    CPC ......... H03H 9/19; H01L 21/561; H01L 24/97;
        Y10T 29/42; Y10T 29/49146; Y10T
        29/49798
    See application file for complete search history.

(56)            References Cited

OTHER PUBLICATIONS

1st Office Action of counterpart Chinese Patent Application No. 201410566200.3 dated Sep. 2, 2016.

\* cited by examiner

METHOD FOR FABRICATING PIEZOELECTRIC QUARTZ RESONATOR

CROSS REFERENCE TO RELATED APPLICATIONS

This application is a continuation application of PCT application No. PCT/CN2014/091108 filed on Nov. 14, 2014, which claims priority to Chinese patent application No. 201410566200.3 filed on Oct. 22, 2014, the entire contents of which are incorporated herein by reference.

FIELD OF THE INVENTION

The present application relates to resonators, and more particularly to a piezoelectric quartz crystal resonator and a method for fabricating the same.

BACKGROUND OF THE INVENTION

A piezoelectric quartz crystal resonator generally has good frequency and temperature characteristics, however, in order to meet a higher requirement for a frequency stability, a frequency of the piezoelectric quartz crystal or an environmental temperature of the piezoelectric quartz crystal needs to be collected, and the frequency and temperature characteristics require corresponding compensations or corrections for meeting actual utilizing requirements.

In an existing piezoelectric quartz crystal resonator including a thermistor, the thermistor and a piezoelectric quartz crystal resonator piece are generally sealed in the same chamber, or the thermistor and the piezoelectric quartz crystal resonator piece are respectively sealed on an upper surface and a lower surface of a base board. The method of sealing the thermistor and the piezoelectric quartz crystal in the same chamber is prone to cause contamination of the piezoelectric quartz crystal and affect stabilities of resonator parameters. The method of sealing the thermistor and the piezoelectric quartz crystal on the upper surface and the lower surface of the base board respectively divides the chamber, however, it may increase the cost of a base seat; moreover, it may further increase the production cost because the assembly process requires special equipments.

SUMMARY OF THE INVENTION

The technical problem to be solved by the present invention is to provide a piezoelectric quartz crystal resonator and a method for fabricating the same, which are used to solve the problem in the prior art that sealing a thermistor and a piezoelectric quartz crystal resonator in the same chamber may cause contamination of the piezoelectric quartz crystal resonator.

The present invention is realized as follows: a piezoelectric quartz crystal resonator, comprising a circuit board, a quartz crystal resonator, and a thermistor; wherein, the thermistor is configured to detect a temperature of the quartz crystal resonator, the thermistor and the quartz crystal resonator are arranged on the circuit board and interconnected with each other via electric wires arranged on the circuit board; the thermistor and the quartz crystal resonator are sealed independently from each other by thermoplastic material, and the thermoplastic material sealing the thermistor is in contact with the thermoplastic material sealing the quartz crystal resonator.

Preferably, the thermistor and the quartz crystal resonator are arranged side by side on the same side of the circuit board, and a clearance is preset between the thermistor and the quartz crystal resonator.

Preferably, the thermistor is arranged on a back of the quartz crystal resonator, and at least one welding pad of the thermistor is connected with at least one welding pad of the quartz crystal resonator.

Preferably, a central portion of the circuit board where the quartz crystal resonator is arranged is provided with a through hole, and the thermistor is arranged in the through hole.

The present invention further provides a method for fabricating a piezoelectric quartz crystal resonator, which comprises the following steps:

Step A: arranging a plurality of design units on a circuit board, wherein each design unit includes a quartz crystal resonator and a thermistor, and a division clearance is preset between every two adjacent design units;

Step B: in each design unit, arranging at least one extension welding pad for the quartz crystal resonator at a bottom layer of the circuit board, and arranging at least one resonator welding pad configured to weld the quartz crystal resonator at a top layer of the circuit board; and at the same time, arranging at least one thermistor welding pad corresponding to the thermistor at the circuit board, wherein the thermistor welding pad is arranged at the same side of the circuit board as the resonator welding pad or the thermistor welding pad and the resonator welding pad are respectively arranged at opposite sides of the circuit board;

Step C: welding the quartz crystal resonator and the thermistor onto their corresponding welding pads respectively;

Step D: using thermoplastic material to seal the welded quartz crystal resonator and thermistor independently from each other, wherein the thermoplastic material sealing the quartz crystal resonator is in contact with the thermoplastic material sealing the thermistor;

Step E: dividing the circuit board processed by the thermoplastic material according to the design units.

Preferably, when the thermistor is arranged at the same side of the circuit board as the quartz crystal resonator, the step C specifically includes the following sub-steps:

Sub-step C01: spreading solder paste on the welding pads of the circuit board, and attaching the quartz crystal resonator and the thermistor on their corresponding locations;

Sub-step C02: after the sub-step C01, performing reflow soldering for the circuit board, and removing scaling powder on the circuit board.

Preferably, when the thermistor and the quartz crystal resonator are respectively arranged at opposite sides of the circuit board, the step C specifically includes the following sub-steps:

Sub-step C101: forming a through hole in a central portion of each quartz crystal resonator on the circuit board, and arranging the welding pad of a corresponding thermistor at two ends of the through hole;

Sub-step C102: spreading solder paste on all resonator welding pads of the quartz crystal resonators on the circuit board, attaching the quartz crystal resonators on their corresponding locations, and performing reflow soldering to weld the quartz crystal resonators firmly;

Sub-step 103: spreading solder paste on all thermistor welding pads of the thermistors arranged at another side of the circuit board, attaching the thermistors on their corresponding locations, performing reflow soldering to weld the thermistors firmly, and removing scaling powder from the circuit board;

Sub-step C104: injecting glue into each through hole, so that the glue fills clearances among the quartz crystal resonators, the thermistors, and the circuit board.

Preferably, in the step A, the plurality of design units are arranged into a matrix.

Compared with the prior art, the present invention has the following advantageous effect: the above-described piezoelectric quartz crystal resonator is shaped by resin injection molding after the quartz crystal resonators and the thermistors are arranged on the circuit board, so that each quartz crystal resonator has an independent chamber; thus, contamination of the quartz crystal resonators caused by the thermistors can be avoided, and the requirement for a higher frequency stability can be met.

DETAILED DESCRIPTION OF THE PREFERRED EMBODIMENT

In order to make the objectives, technical solutions, and advantages of the present invention be clearer, the present invention will be further detailed below with reference to the accompanying drawings and embodiments. It should be understood that the embodiments described herein are only intended to illustrate but not to limit the present invention.

Figure 7:
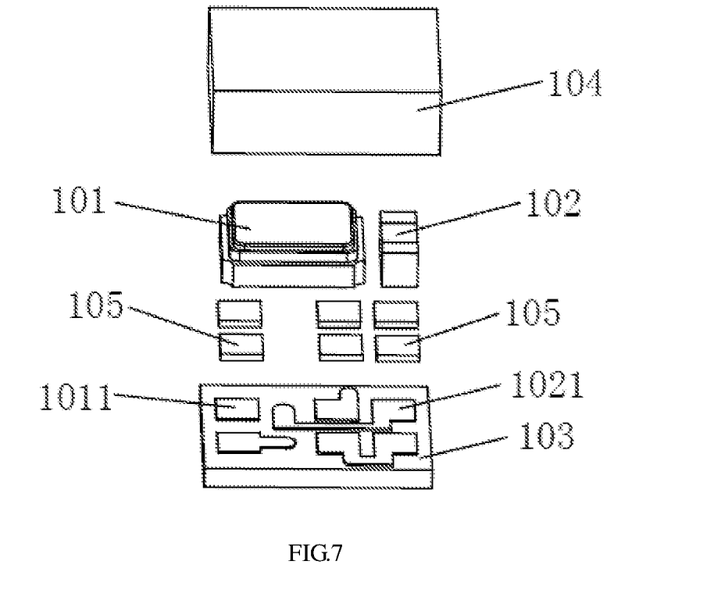
FIG. 7 is a disassembled schematic view of FIG. 6.
Figure 15:
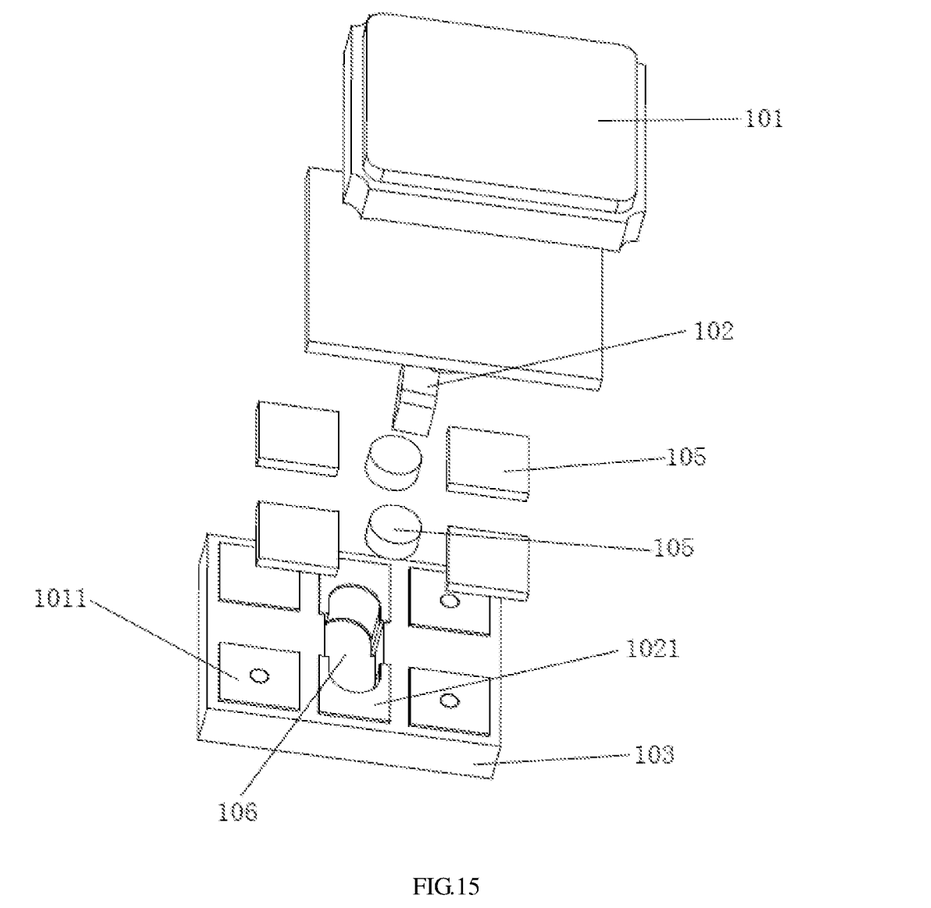
FIG. 15 is a disassembled schematic view of FIG. 14.

Referring to FIG. 7 and FIG. 15, some embodiments of the present invention provide a piezoelectric quartz crystal resonator 100, which includes a circuit board 103, at least one quartz crystal resonator 101, and at least one thermistor 102. The thermistor 102 is configured to detect a temperature of the quartz crystal resonator 101, the thermistor 102 and the quartz crystal resonator 101 are arranged on the circuit board 103 and interconnected with each other via electric wires arranged on the circuit board 103, in particular, at least one welding pad 1011 of the quartz crystal resonator 101 is connected with at least one welding pad 1021 of the thermistor 102 via electric wires arranged on the circuit board 103. The thermistor 102 and the quartz crystal resonator 101 are sealed independently from each other by thermoplastic material 104, and a part of the thermoplastic material 104 that seals the thermistor 102 is in contact with a part of the thermoplastic material 104 that seals the quartz crystal resonator 101, that is, the quartz crystal resonator 101 has an independent chamber.

FIGS. 1-7 show a first embodiment of the piezoelectric quartz crystal resonator 100, wherein the thermistor 102 and the quartz crystal resonator 101 are arranged side by side on the same side of the circuit board 103, and a clearance is preset between the thermistor 102 and the quartz crystal resonator 101.

FIGS. 8-15 show a second embodiment of the piezoelectric quartz crystal resonator 101, wherein the thermistor 102 is arranged on a back of the quartz crystal resonator 101, and at least one welding pad 1021 of the thermistor 102 is connected with at least one welding pad 1011 of the quartz crystal resonator 101. A central portion of the circuit board 103 where the quartz crystal resonator 101 is arranged is provided with a through hole 106, and the thermistor 102 is fixedly arranged in the through hole 106.

The present invention further provides a method for fabricating a piezoelectric quartz crystal resonator. FIGS. 1-7 schematically show steps of a first embodiment of the method, and FIGS. 8-15 schematically show steps of a second embodiment of the method. Each of the first and second embodiments comprises the following steps A to E, and the two embodiments differ from each other mainly in the steps A and C.

Figure 1:
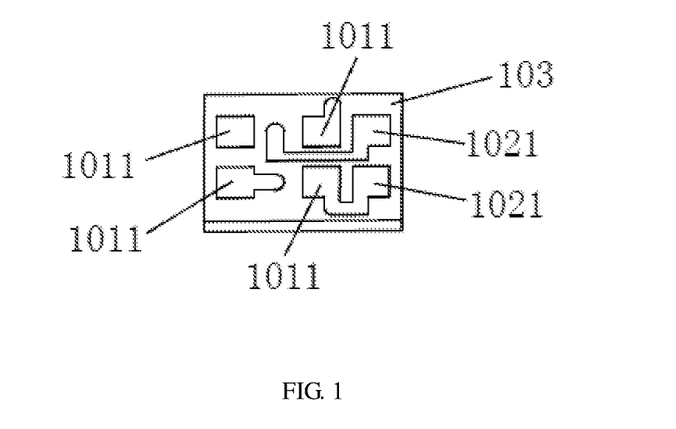
FIG. 1 is a schematic view of a plurality of design units of a circuit board of a piezoelectric quartz crystal resonator fabricated by a method in accordance with a first embodiment of the present invention.
Figure 2:
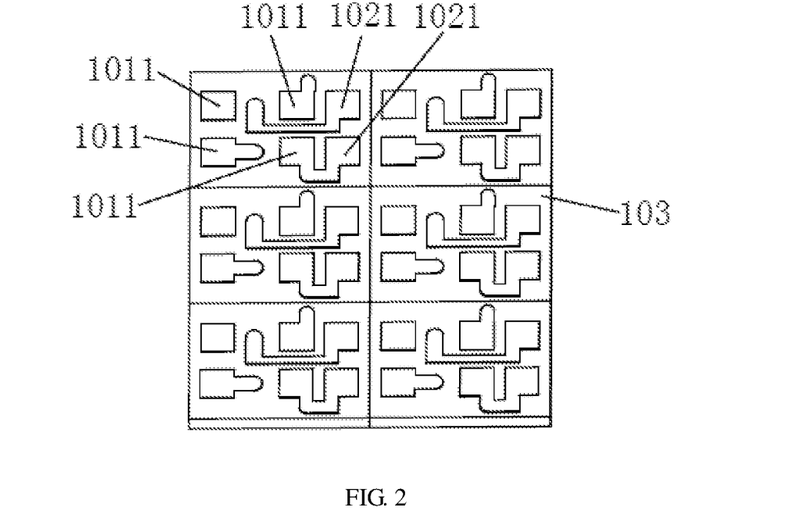
FIG. 2 is a schematic view of a matrix formed by the plurality of design units shown in FIG. 1.
Figure 8:
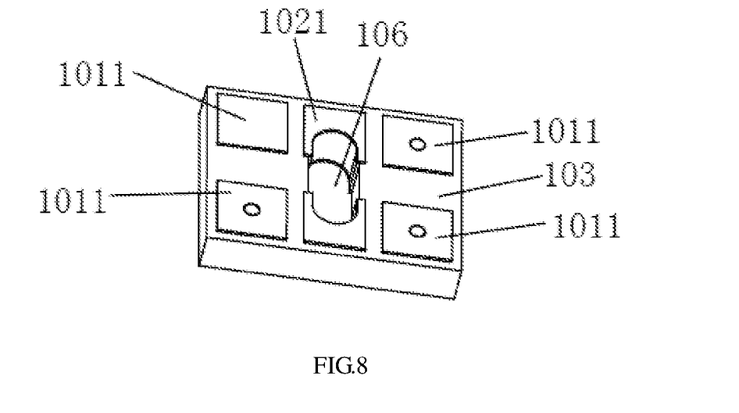
FIG. 8 is a schematic view of a plurality of design units of a circuit board of a piezoelectric quartz crystal resonator fabricated by a method in accordance with a second embodiment of the present invention.
Figure 9:
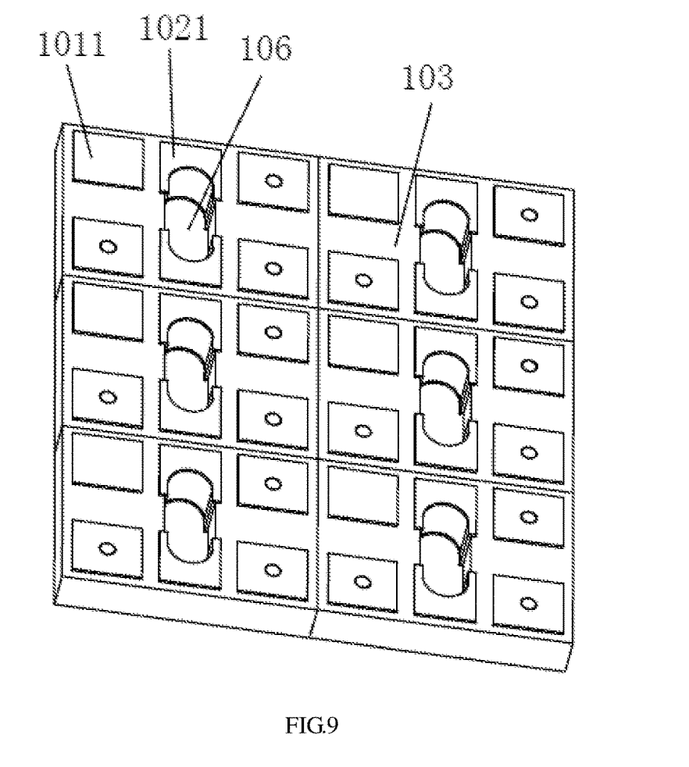
FIG. 9 is a schematic view of a matrix formed by the plurality of design units shown in FIG. 8.
Figure 10:
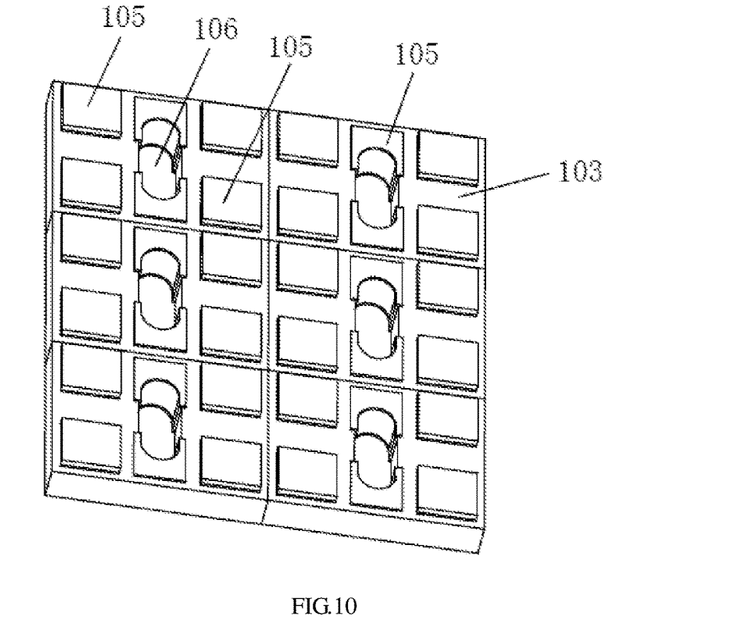
FIG. 10 is a schematic view of welding pads with solder paste spread thereon of the circuit board shown in FIG. 9.

Step A: arranging a plurality of design units on a circuit board 103, wherein each design unit includes a quartz crystal resonator 101 and a thermistor 102, and a division clearance is preset between every two adjacent design units, as shown in FIG. 1 or FIG. 8. Preferably, the plurality of design units can be arranged into a matrix, and an appropriate division clearance can be preset between every two adjacent design units, as shown in FIG. 2 and FIG. 9.

Step B: in each design unit, arranging at least one extension welding pad for the quartz crystal resonator 101 at a bottom layer of the circuit board 103, and arranging at least one resonator welding pad 1011 configured to weld the quartz crystal resonator 101 at a top layer of the circuit board 103; at the same time, arranging at least one thermistor welding pad 1021 corresponding to the thermistor 102 at the circuit board 103, wherein the thermistor welding pad 1021 is arranged at the same side of the circuit board 103 as the resonator welding pad 1011 or the thermistor welding pad 1021 and the resonator welding pad 1011 are respectively arranged at opposite sides of the circuit board 103.

Step C: welding the quartz crystal resonator 101 and the thermistor 102 onto their corresponding welding pads respectively.

Step D: using thermoplastic material 104 to seal the welded quartz crystal resonator 101 and thermistor 102 independently from each other, wherein a part of the thermoplastic material 104 that seals the quartz crystal resonator 101 is in contact with a part of thermoplastic material 104 that seals the thermistor 102.

Step E: dividing the circuit board 103 sealed by the thermoplastic material 104 according to the design units, so that each piezoelectric quartz crystal resonator 100 segmented from the circuit board 103 includes a thermistor 102 and a quartz crystal resonator 101.

In the first embodiment of the method, the at least one welding pad 1011 of the quartz crystal resonator 101 and the at least one welding pad 1021 of the thermistor 102 are arranged at adjacent locations on the same side of the circuit board 103. In particular, a bottom layer of the circuit board 103 can be provided with four welding pads, and the four welding pads can serve as extension welding pads of one quartz crystal resonator 101. For example, the four welding pads can be a welding pad A, a welding pad B, a welding pad C, and a welding pad D respectively; the welding pad A is a first electrode of the quartz crystal resonator 101; the welding pad B is a grounded end, and is also connected with a second extension end of a thermistor 102; the welding pad C is a second electrode of the quartz crystal resonator 101; and the welding pad D is a first extension end of the thermistor 102. A top layer of the circuit board 103 is provided with four resonator welding pads corresponding to a sealing location of the quartz crystal resonator 101, and the four resonator welding pads are configured to weld the quartz crystal resonator 101. Furthermore, in addition to the four extension welding pads A, B, C, and D and the four resonator welding pads, the circuit board 103 is further provided with two thermistor welding pads corresponding to a sealing location of the thermistor 102, and the two thermistor welding pads are configured to weld the thermistor 102. The welding pads on the top layer of the circuit board 103 are connected with the welding pads on the bottom layer of the circuit board 103 via electrically conductive and metallic via holes, as shown in FIG. 1.

Figure 3:
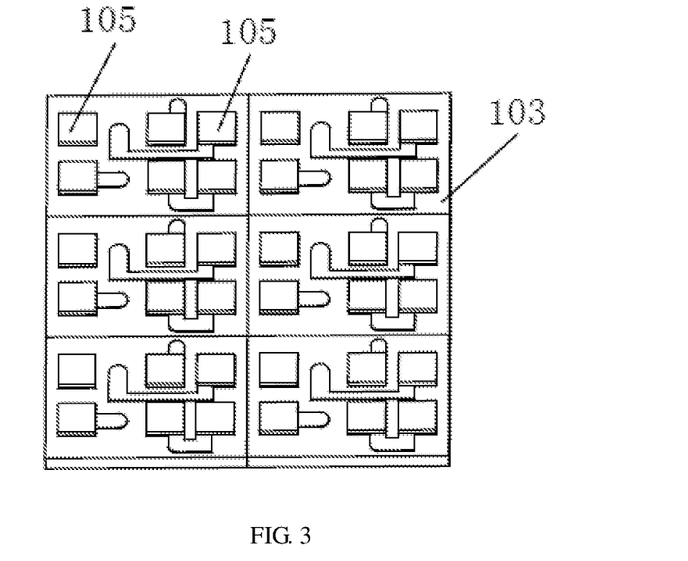
FIG. 3 is a schematic view of welding pads with solder paste spread thereon of the circuit board shown in FIG. 2.
Figure 4:
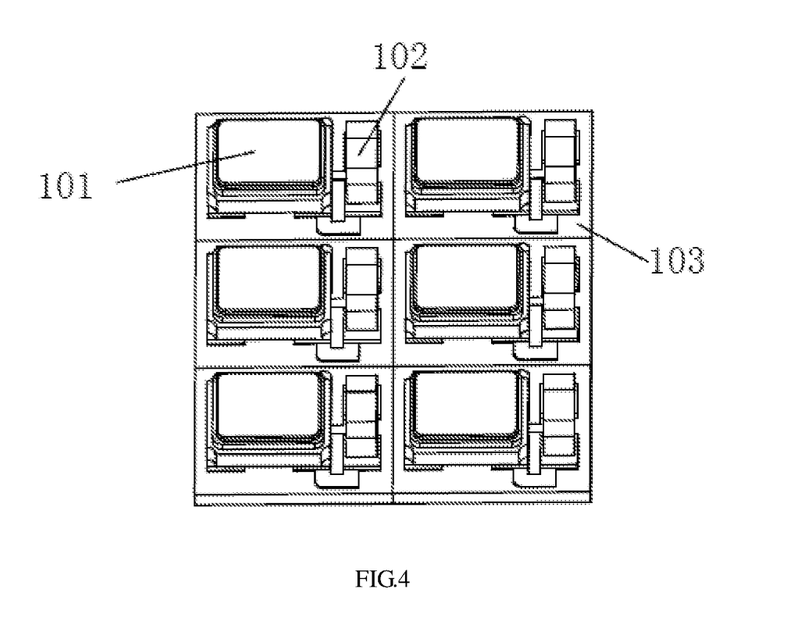
FIG. 4 is a schematic view of welding quartz crystal resonators and thermistors on the welding pads shown in FIG. 3.
Figure 5:
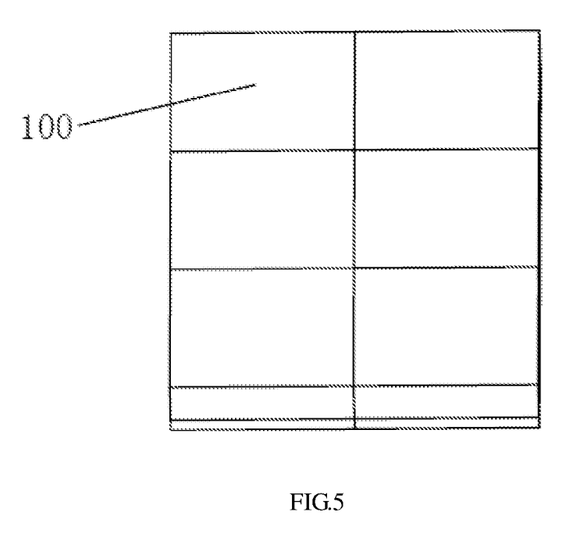
FIG. 5 is a schematic view of injection molding for the quartz crystal resonators and thermistors shown in FIG. 4.
Figure 6:
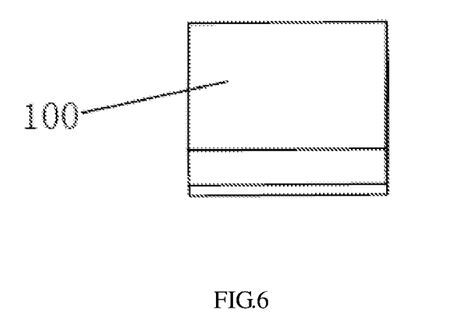
FIG. 6 is a schematic view of dividing the circuit with the quartz crystal resonators and the thermistors shown in FIG. 5 into single quartz crystal resonators.

When the first embodiment of the method is performed, the step C specifically includes the following sub-steps. Sub-step C01: spreading solder paste 105 on the welding pads of the circuit board 103 (comprising the welding pad 1011 of the quartz crystal resonator 101 and the welding pad 1021 of the thermistor 102), as shown in FIG. 3, and attaching the quartz crystal resonator 101 and the thermistor 102 on their corresponding locations. Sub-step C02: after the sub-step C01, performing reflow soldering for the circuit board 103, and removing scaling powder on the circuit board 103, as shown in FIG. 4.

In the second embodiment of the method, the at least one welding pad 1011 of the quartz crystal resonator 101 and the at least one welding pad 1021 of the thermistor 102 are respectively arranged at opposite sides of the circuit board 103. In this embodiment, the thermistor 102 is arranged at a back of the quartz crystal resonator 101 and inside the circuit board 103, as shown in FIG. 8. In particular, a bottom layer of the circuit board 103 can be provided with four welding pads, and the four welding pads can serve as extension welding pads of one quartz crystal resonator 101. For example, the four welding pads can be a welding pad A, a welding pad B, a welding pad C, and a welding pad D respectively; the welding pad A is a first electrode of the quartz crystal resonator 101; the welding pad B is a grounded end, and is also connected with a second extension end of a thermistor 102; the welding pad C is a second electrode of the quartz crystal resonator 101; and the welding pad D is a first extension end of the thermistor 102. A top layer of the circuit board 103 is provided with four resonator welding pads corresponding to a sealing location of the quartz crystal resonator 101, and the four resonator welding pads are configured to weld the quartz crystal resonator 101. At the same time, at least one of the four extension welding pads A, B, C, and D of the circuit board 103 is provided with a through hole 106, and two thermistor welding pads 1021 are respectively arranged at two ends of the through hole 106 to assemble and weld the thermistor 102. The welding pads on the top layer of the circuit board 103 are connected with the welding pads on the bottom layer of the circuit board 103 via electrically conductive and metallic via holes, and a thickness of the circuit board 103 is slightly larger than a thickness of the thermistor 102, as shown in FIG. 8.

Figure 11:
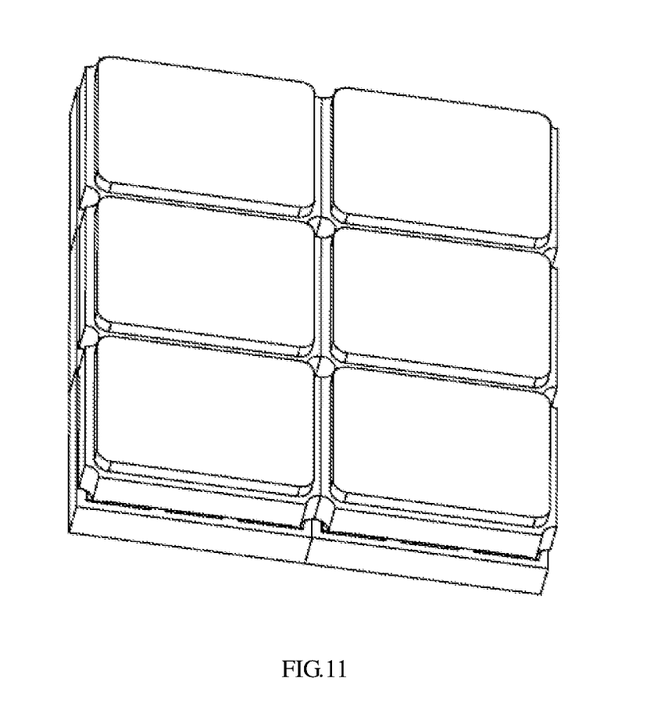
FIG. 11 is a schematic view of welding quartz crystal resonators on some welding pads shown in FIG. 10.
Figure 12:
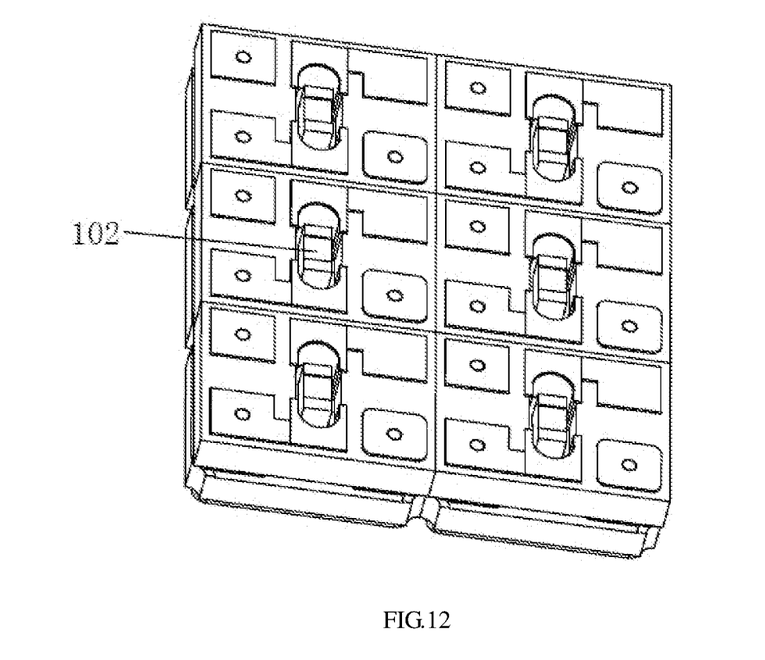
FIG. 12 is a schematic view of welding quartz crystal resonators on others welding pads shown in FIG. 10.
Figure 13:
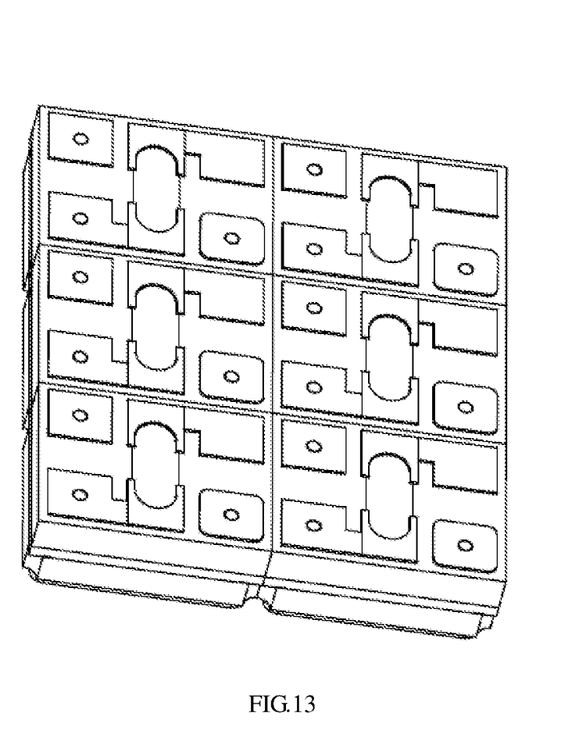
FIG. 13 is a schematic view of filling through holes shown in FIG. 12 with glue.
Figure 14:
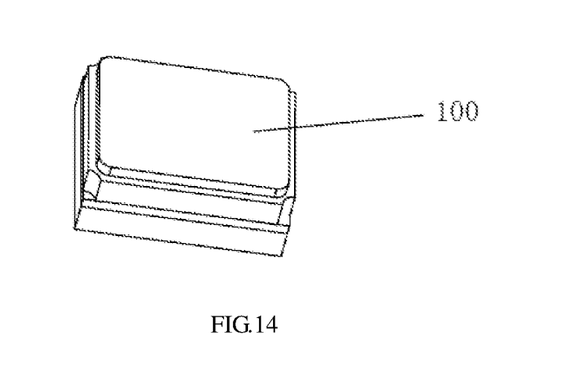
FIG. 14 is a schematic view of dividing the circuit with the quartz crystal resonators and the thermistors shown in FIG. 13.

When the second embodiment of the method is performed, the step C specifically includes the following sub-steps: spreading solder paste 105 on all resonator welding pads 1011 of the quartz crystal resonators 101 on the circuit board 103, attaching the quartz crystal resonators 101 on their corresponding locations, and performing reflow soldering to weld the quartz crystal resonators 101 firmly, as shown in FIG. 11; spreading solder paste on all thermistor welding pads 1021 of the thermistors 102 arranged at another side of the circuit board 103, attaching the thermistors 102 on their corresponding locations (e.g., attaching each thermistor 102 inside a corresponding through hole 106), performing reflow soldering to weld the thermistors 102 firmly, and removing scaling powder from the circuit board 103, as shown in FIG. 12; injecting glue into each through hole 106, so that the glue fills clearances among the quartz crystal resonators 101, the thermistors 102, and the circuit board 103.

The aforementioned piezoelectric quartz crystal resonator can be used in various conditions that require good frequency characteristics and high stabilities, for example, smart phones, smart terminals, Global Positioning System (GPS), and so on, and can also be used in temperature compensation quartz crystal oscillators or other electronic devices that require high frequency stabilities.

The aforementioned piezoelectric quartz crystal resonator ensures that each quartz crystal resonator thereof has an independent chamber, enables the thermistors thereof to collect temperatures of the quartz crystal resonators, and can meet the requirement for a higher frequency stability. Furthermore, adopting the fabricating method provided by the present invention can reduce fabrication cost and facilitate mass production.

What described above are only preferred embodiments of the present invention and are not intended to limit the present invention. Any modifications, equivalent changes, and improvements made within the spirit and principle of the present invention should be included in the protection scope of the present invention.

What is claimed is:

1. A method for fabricating a piezoelectric quartz crystal resonator, comprising the following steps:
   Step A: arranging a plurality of design units on a circuit board, wherein each one of the plurality of design units includes a quartz crystal resonator and a thermistor, and a division clearance is preset between every two adjacent ones of the plurality of design units;
   Step B: in each one of the plurality of design unit units, arranging at least one extension welding pad for the quartz crystal resonator at a bottom side of the circuit board, and arranging at least one resonator welding pad configured to weld the quartz crystal resonator at a top side of the circuit board; and at a same time, arranging at least one thermistor welding pad corresponding to the thermistor at the circuit board, wherein the at least one thermistor welding pad is arranged at a same side of the circuit board as the at least one resonator welding pad or the at least one thermistor welding pad and the at least one resonator welding pad are respectively arranged at opposite sides of the circuit board;

Step C: welding the quartz crystal resonator and the thermistor onto the corresponding at least one resonator welding pad and at least one thermistor welding pad, respectively;

Step D: using thermoplastic material to seal the welded quartz crystal resonator and thermistor independently from each other, wherein the thermoplastic material sealing the quartz crystal resonator is in contact with the thermoplastic material sealing the thermistor;

Step E: dividing the circuit board processed by the thermoplastic material according to the plurality of design units.

2. The method for fabricating a piezoelectric quartz crystal resonator according to claim 1, wherein, when the thermistor is arranged at the same side of the circuit board as the quartz crystal resonator, the step C includes the following sub-steps:

Sub-step C01: spreading solder paste on both the at least one thermistor welding pad and the at least one resonator welding pad of the circuit board, and attaching the quartz crystal resonator and the thermistor on their corresponding locations of the at least one resonator welding pad and the at least one thermistor welding pad, respectively;

Sub-step C02: after the sub-step C01, performing reflow soldering for the circuit board, and removing scaling powder on the circuit board.

3. The method for fabricating a piezoelectric quartz crystal resonator according to claim 1, wherein, when the thermistor and the quartz crystal resonator are respectively arranged at opposite sides of the circuit board, the step C includes the following sub-steps:

Sub-step C101: forming a through hole in a central portion of each of the quartz crystal resonators on the circuit board, and arranging the at least one thermistor welding pad of a corresponding thermistor at two ends of the through hole;

Sub-step C102: spreading solder paste on all resonator welding pads of the quartz crystal resonators on the circuit board, attaching the quartz crystal resonators on the resonator welding pads, and performing reflow soldering to weld the quartz crystal resonators firmly;

Sub-step 103: spreading solder paste on all thermistor welding pads of the thermistors arranged at another side of the circuit board, attaching the thermistors on the thermistor welding pads, performing reflow soldering to weld the thermistors firmly, and removing scaling powder from the circuit board;

Sub-step C104: injecting glue into each of the through holes, so that the glue fills clearances among the quartz crystal resonators, the thermistors, and the circuit board.

4. The method for fabricating a piezoelectric quartz crystal resonator according to claim 1, wherein, in the step A, the plurality of design units are arranged into a matrix.

* * * * *